US008837098B2

(12) United States Patent
Victor et al.

(10) Patent No.: US 8,837,098 B2
(45) Date of Patent: *Sep. 16, 2014

(54) METHOD FOR LIMITING THE GENERATOR VOLTAGE OF A PHOTOVOLTAIC INSTALLATION IN CASE OF DANGER AND PHOTOVOLTAIC INSTALLATION

(71) Applicant: SMA Solar Technology AG, Niestetal (DE)

(72) Inventors: Matthias Victor, Niestetal (DE); Gerd Bettenwort, Kassel (DE); Frank Greizer, Kaufungen (DE); Adrian Haering, Niestetal (DE); Joachim Laschinski, Kassel (DE); Bernd Engel, Wolfenbuettel (DE)

(73) Assignee: SMA Solar Technology AG, Niestetal (DE)

( * ) Notice: Subject to any disclaimer, the term of this patent is extended or adjusted under 35 U.S.C. 154(b) by 15 days.

This patent is subject to a terminal disclaimer.

(21) Appl. No.: 13/667,607

(22) Filed: Nov. 2, 2012

(65) Prior Publication Data
US 2013/0057989 A1    Mar. 7, 2013

Related U.S. Application Data

(63) Continuation of application No. PCT/EP2011/057043, filed on May 3, 2011.

(30) Foreign Application Priority Data

May 3, 2010    (DE) .......................... 10 2010 016 753
Jul. 5, 2010    (DE) .......................... 10 2010 017 747

(51) Int. Cl.
*H02H 3/00*    (2006.01)
*H01L 31/02*    (2006.01)
*H02J 3/38*    (2006.01)
*H02H 7/20*    (2006.01)

(52) U.S. Cl.
CPC ........... *H01L 31/02021* (2013.01); *H02H 7/20* (2013.01); *Y02B 10/14* (2013.01); *Y02B 10/12* (2013.01); *Y02E 10/563* (2013.01); *H02J 3/383* (2013.01)
USPC ........................................... 361/42

(58) Field of Classification Search
USPC ........................................ 361/42
See application file for complete search history.

(56) References Cited

U.S. PATENT DOCUMENTS 4,333,136 A * 6/1982 Baker ........................... 363/43
(Continued)

FOREIGN PATENT DOCUMENTS

DE        102005018173 A1    10/2006
(Continued)

OTHER PUBLICATIONS

International Preliminary Report on Patentability dated Nov. 6, 2012 for application No. PCT/EP2011/057043.

(Continued)

*Primary Examiner* — Ronald W Leja
(74) *Attorney, Agent, or Firm* — Eschweiler & Associates, LLC

(57) ABSTRACT

A protection system configured to couple between a generator that has a number of partial strings and an inverter includes a control device, and a series-connection switching device configured to selectively connect the partial strings together in series. The system also includes a parallel-connection switching device configured to selectively connect the partial strings together in parallel, wherein the series-connection switching device is actuated by the control device such that it interrupts the series connection of the partial strings in case of a hazard, and the parallel-connection switching device is actuated by the control device such that it connects the partial strings together in parallel in case of a hazard.

21 Claims, 5 Drawing Sheets

(56) References Cited

U.S. PATENT DOCUMENTS

| | | |
|---|---|---|
| 6,268,559 B1 | 7/2001 | Yamawaki |
| 6,545,211 B1 | 4/2003 | Mimura |
| 6,593,520 B2 | 7/2003 | Kondo et al. |
| 2006/0004531 A1* | 1/2006 | Ye et al. .................... 702/60 |
| 2006/0162772 A1 | 7/2006 | Presher, Jr. et al. |
| 2009/0141522 A1 | 6/2009 | Adest et al. |
| 2010/0300508 A1 | 12/2010 | Maier et al. |
| 2011/0090607 A1* | 4/2011 | Luebke et al. ............... 361/42 |
| 2011/0157753 A1* | 6/2011 | Gilmore et al. .............. 361/42 |
| 2011/0188276 A1* | 8/2011 | Schill ........................ 363/131 |
| 2011/0188277 A1* | 8/2011 | Schill ........................ 363/131 |
| 2011/0234004 A1* | 9/2011 | Beck ............................ 307/71 |
| 2012/0161527 A1* | 6/2012 | Casey et al. .................. 307/80 |
| 2012/0163048 A1 | 6/2012 | Victor et al. ................. 363/55 |
| 2013/0057989 A1* | 3/2013 | Victor et al. ................. 361/42 |
| 2013/0058140 A1* | 3/2013 | Victor et al. ............. 363/56.01 |
| 2013/0308356 A1* | 11/2013 | Subramanium et al. ........ 363/53 |

FOREIGN PATENT DOCUMENTS

| | | |
|---|---|---|
| DE | 102006023563 A1 | 11/2007 |
| DE | 102006060815 A1 | 6/2008 |
| DE | 102008021654 B3 | 12/2009 |
| EP | 1039361 A1 | 9/2000 |
| EP | 2101391 A2 | 9/2009 |
| EP | 2173024 A2 * | 4/2010 |
| JP | 9182279 A | 7/1997 |
| JP | 2001068706 A | 3/2001 |
| WO | 2010020385 A2 | 2/2010 |
| WO | 2010078303 A2 | 7/2010 |

OTHER PUBLICATIONS

International Search Report dated Sep. 16, 2011 in connection with PCT Patent Application PCT/EP2011/057035.

German Search Report dated Mar. 2, 2011 in connection with German Patent Application 102010017746.6.

German Search Report dated Jun. 14, 2011 in connection with German Patent Application 102010017747.4.

International Search Report dated Sep. 16, 2011 in connection with PCT Patent Application PCT/EP2011/057043.

U.S. Appl. No. 13/667,532, filed Nov. 2, 2012. 20 Pages.

* cited by examiner

METHOD FOR LIMITING THE GENERATOR VOLTAGE OF A PHOTOVOLTAIC INSTALLATION IN CASE OF DANGER AND PHOTOVOLTAIC INSTALLATION

CROSS REFERENCE TO RELATED APPLICATIONS

This application is a continuation of International Application number PCT/EP2011/057043 filed on May 3, 2011, which claims priority to German Application number 102010016753.3 filed on May 3, 2010, and German Application number 102010017747.4 filed on Jul. 5, 2010.

FIELD

The present invention relates to a photovoltaic installation with a device for the limitation of voltage in case of a hazard. In particular, the invention relates to a device that ensures that voltages or voltage differences in an installation of this type will not exceed a given hazard limit value, in case of a hazard or potential hazard to persons or property. The invention also relates to a method for limiting a generator voltage in case of a hazard.

BACKGROUND

As decentralized energy supply facilities become more widespread, specifically solar power installations, which are installed on the roofs of houses, on commercial buildings or on open ground, there is increasing awareness of the fact that, in case of a hazard such as fire or storm, or for the conduct of maintenance operations, a reliable facility must be available for the conductive parts of these installations to be made safe at any time. The accessibility or effectiveness of disconnection devices may be compromised in case of a hazard, in that preliminary damage associated e.g. with the effects of heat and smoke may preclude the reliable and sustainable action of safety measures or prevent access to tripping mechanisms. In consequence, for example, extinguishing measures on the roof frame of a burning house cannot be undertaken when there is a risk that fire fighters might be injured by the high d.c. (direct current) voltages associated with a photovoltaic installation, which may still be operational.

For the protection of persons and for the prevention of material damage by high d.c. voltages in a photovoltaic installation, DE 102005018173 proposes a device whereby the generator of the installation is short-circuited by means of a protective device that is arranged close to the generator. A disadvantage of this embodiment is the fact that the delivery of energy, to the building and consequently to an electricity grid via an inverter that is connected to the generator, is no longer possible.

Publication DE 102006060815 discloses a switching element, associated with a respective photovoltaic module, that is arranged in such a way that when the switching element is activated the associated module is de-energized. The switching element is activated by means of a high-frequency signal that is modulated on the d.c. line. In the solutions described in DE 102006060815, the delivery of energy to an electricity grid via an inverter is likewise precluded, given that, in all disclosed embodiments, the generator isde-energized. Moreover, the arrangement of a switching element at each module in a potentially multiple number of strings is associated with a not inconsiderable level of expenditure on circuitry.

SUMMARY

In one embodiment the present invention comprises a device/method that provides, with an acceptable level of expenditure and in case of a potential hazard, the possibility for the reliable limitation of the voltages or voltage differences generated by the generators of a photovoltaic installation on the electric power lines of the installation, to the extent that measures for the control of the hazard concerned can be undertaken with no risk of injury to the emergency service personnel deployed for this purpose. At the same time, in one embodiment it should still be possible to feed power into an electricity grid at a reduced voltage via an inverter that is connected to the generator.

The photovoltaic installation according to one embodiment of the invention comprises an inverter for feeding electrical energy generated by a generator of the installation into an electricity grid, in particular an a.c. (alternating current) grid. The generator is divided into a number of partial strings that can be connected in series by means of a series-connection switching device that is controlled by a control device. The photovoltaic installation also comprises a parallel-connection switching device, controlled by the control device, by means of which the individual partial strings can be connected in parallel. The photovoltaic installation is configured such that, in case of a hazard, the series connection of the partial strings is opened, and the partial strings are connected in parallel.

Each of the partial strings comprises a number of modules or individual solar cells that are configured such that the value of the open-circuit voltage at each partial string does not exceed a hazard limit value (e.g., such as one defined by the statutory authorities). In case of a hazard, the series-connection switching device ensures that the electrical connection between the partial strings is opened, such that voltages or voltage differences at the electrical lines between the inverter and the partial strings can no longer exceed the hazard limit value.

A partial string generally comprises series-connected modules, which in turn comprise series-connected solar cells. Depending upon the type of module used, the voltage rating of the module may be such that the hazard limit value will be exceeded if two modules are connected in series. In this case, a partial string may also comprise a single module. A partial string may also comprise a number of parallel-connected strings, the voltage rating of which does not exceed the hazard limit value.

The statutory hazard limit value may be subject to regional variations, e.g., although a voltage of 120 V is possible, other limiting values may be stipulated within a range of 60 V and 150 V, e.g. 100 V.

In one embodiment of the invention, the generator connected to the inverter comprises at least three partial strings that are to be switched in series by the series-connection switching device. With this configuration the value of the overall generator voltage may exceed the peak voltage of the electricity grid (e.g. 350 V) at the optimum operating point of the generator, such that feeding power to the electricity grid is possible without the use of a step-up converter in the inverter. At the same time, the open-circuit voltage of the individual partial strings can remain below the hazard limit value specified above. When three partial strings are used, however, it will frequently be necessary for the generator to operate at a higher voltage than that associated with the maximum power output of the generator concerned, in order to ensure that the peak voltage of the electricity grid is exceeded. Accordingly, it may be advantageous to connect a minimum of four partial strings in series, thereby allowing the generator to operate at the operating point for maximum power output, whereby the open-circuit voltage of the individual partial strings can remain below a hazard limit value of 120 V. When different hazard limit values apply, the number of partial strings required for achieving this effect may be defined accordingly.

In one embodiment the series-connection switching device has a number of switches that are controllable by means of a control device such that, when the photovoltaic installation is in operating condition, an electrical connection is closed between adjacent partial strings, and this connection is opened under potentially hazardous conditions. Just as with the series-connection switching device, the parallel-connection switching device may also have a number of switches. The switches of the series-connection switching device and the parallel-connection switching device may be, for example, mechanical switches, such as relays, or semi-conductors, specifically power semi-conductors such as MOSFETs, IGBTs or thyristors.

By integrating the series-connection switching device and the parallel-connection switching device in an inverter housing, a straightforward installation of the safety system can be achieved. At the same time, the reliable tripping of the safety system in case of a hazard is significantly enhanced, specifically when all associated components are arranged in the inverter housing where, for a considerable time at least, these components will be protected not only from damage associated with the effects of smoke and heat, but also from the effects of weathering, which are typically encountered in the vicinity of a generator. The series-connection switching device and/or the parallel-connection switching device may also be arranged at the generator itself, whereby the switching elements of the series-connection switching device and/or of the parallel-connection switching device may be arranged either in a common unit or in separate units at the partial strings, or between the partial strings. Arrangement on the generator offers an advantage over the arrangement in the inverter, in that expenditure on cabling may be reduced substantially. Naturally, the series-connection switching device and/or the parallel-connection switching device may also be housed in a separate box, which may be arranged in the vicinity of the inverter, in the vicinity of the generator, or between the generator and the inverter. The arrangement in an appropriate position between the generator and the inverter may also allow the achievement of an effective compromise between the protection of the switching device on the one hand and expenditure on cabling on the other hand. This arrangement also permits the retrofitting, upgrading or conversion of an existing installation.

As many photovoltaic installations are already equipped with communication technologies, such as powerline communication, or radio communication technologies such as Bluetooth, ZigBee or similar, which permit the exchange of data with remote communication units, both the accessibility of the control and tripping device, and feedback on the successful tripping of the safety system can be advantageously guaranteed. At the same time, it is also possible for a number of photovoltaic installations to be protected by a single trip signal, thereby resulting in a considerable time saving in case of a hazard.

The parallel-connection switching device is typically actuated when the series-connection switching device has opened the electrical connection between adjacent partial strings. In this state, it is also guaranteed that voltages or voltage differences occurring in the installation will not exceed the hazard limit value. Additionally, in this state, it is also possible for the generator to continue the feeding of electric power to the electricity grid at a reduced voltage, via the inverter. In this case, for feeding power to the electricity grid, it will at first be necessary for the generator voltage to be converted to a sufficiently high d.c. voltage by means of a step-up converter. In this way, for example, the feeding of power can be continued during the execution of prolonged maintenance operations in the vicinity of the generator, as the risk to persons undertaking the execution of maintenance can be sufficiently restricted by the reduction of the generator voltage. In case of the occurrence of spurious alarms, the continuation of power feeding can also help to avoid unnecessary loss on the energy output of the photovoltaic installation concerned. Even in case of fire, the continuing feeding of power from a photovoltaic installation according to the invention would pose no hazard to emergency service personnel.

It is also possible that the switches of the series-connection switching device and the parallel-connection switching device might be closed simultaneously, such that, under these conditions, the connected partial string will be short-circuited, thereby also eliminating any hazard associated with the generator voltage.

Alternatively, the short-circuiting function can also be achieved by means of an additional short-circuiting device that is arranged between the electric lines connecting the series-connection switching device and the inverter.

The inverter and the generator may also be disconnected from each other by a d.c. disconnecting device. The short-circuiting device and the d.c. disconnecting device may also be provided with switches of the type listed with reference to the series-connection switching device.

As an option, the photovoltaic installation may also additionally comprise a grounding device that has, just like the series-connection switching device and the parallel-connection switching device, a number of switches that are configured such that when being in the closed position at least one of the terminals of at least one of the partial strings is connected to ground. The grounding device may comprise switches of the type listed with reference to the series-connection switching device, the potential arrangement of which in units in the inverter, at the generator or between the generator and the inverter corresponds to the arrangement of the series-connection switching device or the parallel-connection switching device.

Typically, the grounding device is actuated when the series-connection switching device has opened the electrical connection between adjacent partial strings. In this state, depending upon the presence or absence of a ground connection for the components of the photovoltaic installation, voltages at the partial string with respect to ground may exceed the hazard limit value. This is prevented by establishing a specific potential on one terminal of the partial string by means of the grounding device. The grounding device can also be activated in conjunction with the parallel-connection switching device.

Using the switches of the grounding device, it is also possible that both terminals of the partial string may simultaneously be connected to ground such that, in this state, the connected partial string is short-circuited via ground, thereby also eliminating any hazard associated with the generator voltage. A safe condition can also be achieved by establishing a connection to ground between all the partial strings.

In one embodiment the series-connection switching device, the parallel-connection switching device, the grounding device, the short-circuiting device and the d.c. disconnecting device are controlled by a central control device, depending upon the existence of an operating state or signal that is associated with a given hazard situation. To this end, the control device can be configured to recognize operating states of the photovoltaic installation that are associated with a hazard condition, such as variations in the electrical parameters of the photovoltaic installation that are typically indicative of a hazard. The control device can also be configured to receive a signal that is associated with a given hazard condition and that may be generated by the inverter, e.g., when the latter detects an islanding situation, or else by a separate sensor device or by a manual emergency shutdown device. The transmission of the signal to the control device may be carried out by means of an electrical control cable, by a wireless connection, or via the existing d.c. or a.c. lines routed to the control device. Although wireless connection may be provided in the form of a radio link, other options for wireless signal transmission are also possible, like infrared, acoustic or ultrasound transmission, mechanical actuators, hydraulic actuators or pneumatic actuators.

In a method according to the invention, the installation is initially operated at a generator voltage that exceeds the hazard limit value. In this operating state, the installation will typically operate with a special efficiency. Immediately when a hazard condition is detected, the installation is restricted to a generator voltage that lies below the hazard limit value.

A hazard situation or hazard condition may exist in case of an islanding situation, i.e. when the inverter is disconnected from the electricity grid or when the electricity grid is shut down, when an electric arc or ground fault is detected on the electrical lines of the photovoltaic installation, or when a generator disconnection device, e.g. a so-called "electronic solar switch", is tripped on the inverter. A hazard situation or hazard condition may also occur when a manual emergency shutdown device is actuated, when variations in electrical parameters of the photovoltaic installation are detected that are typically indicative of a hazard, or in case of the response of external sensors, such as temperature sensors, smoke detectors or infrared detectors. If the photovoltaic installation forms part of a data network with other adjoining photovoltaic installations or inverters, or with other communication units, a signal associated with a hazard situation may also be transmitted from one installation to the next, such that the installations can respond jointly to the hazard situation concerned.

A continued feeding of electric power into an electricity grid to which the photovoltaic installation is connected can be achieved, despite the reduction of the generator voltage, provided that the generator voltage that has been reduced below the hazard limit value is at first raised by means of a step-up converter to a d.c value that is sufficiently high for an inverter bridge to generate an a.c. voltage that can be fed into the electricity grid. For example, the step-up converter can raise a generator voltage of less than 120 V to an intermediate circuit voltage in excess of 325 V, thereby allowing the direct feeding of electric power into a public electricity grid.

In one embodiment of the method according to the invention, the individual partial strings of the generator, in case of the operation of the photovoltaic installation above the hazard limit value, will operate in a series connection, which may be provided, e.g., by the series-connection switching device described above, whereas the reduced generator voltage is achieved by the operation of the partial strings in a parallel circuit arrangement, which may be provided, e.g., by the parallel-connection switching device described above. Accordingly, upon the detection of a hazard condition, there is a switchover of the partial strings from series connection to parallel connection.

As an option, the method may be extended to include a further act, in which, in response to the detection of a hazard condition, an electrical connection is established between at least one of the terminals of at least one of the partial strings and ground, thereby establishing a specific potential on this terminal with respect to ground. A ground connection of this type may be established, e.g., by the grounding device described above.

According to a further embodiment of the method, the generator voltage can be set by the current or voltage control system of an inverter to a voltage that lies below the hazard limit value.

In another embodiment of the method according to the invention, the setting of the generator voltage to a value below the hazard limit value is achieved by the short-circuiting of at least one partial string of the generator, including short-circuiting via ground. This short-circuiting of at least a part of the generator can also be applied as an additional measure after the generator voltage has been reduced to a level that lies below the hazard limit value, e.g., when the further feeding of electric power into an electricity grid is no longer possible. In this case, in the absence of short-circuiting, the generator voltage would otherwise possibly rise to a value that exceeds the hazard limit value. This short-circuiting function may be actuated, for example, in case of the detection of an islanding situation by the inverter.

BRIEF DESCRIPTION OF THE DRAWINGS

Further properties, features and advantages of the invention will arise from the following detailed description of embodiments of the invention, with reference to the attached drawings.

DETAILED DESCRIPTION

Figure 1:
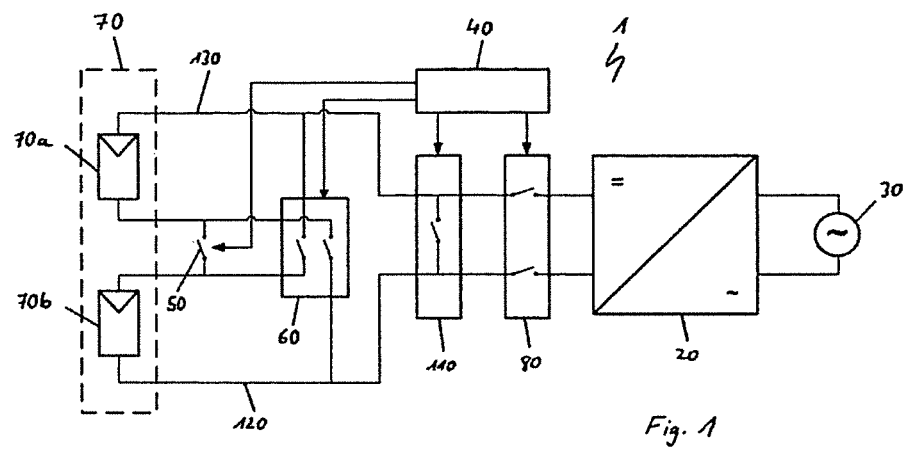
FIG. 1 shows a photovoltaic installation according to one embodiment of the invention, with an additional d.c. disconnecting device and an additional short-circuiting device.

FIG. 1 shows the design of a photovoltaic installation 1 according to the invention with an inverter 20 that is, on the a.c. side, connected to an electricity grid 30, e.g., a public a.c. grid. On the d.c. side of the inverter 20, the latter is connected to a generator 70 by means of connecting lines 120, 130. The generator 70 is divided into two partial strings 70a, 70b that can be connected in series to each other by means of a switch in a series-connection switching device 50. By means of a parallel-connection switching device 60, the individual partial strings can also be connected in parallel to each other.

The series-connection switching device 50 and the parallel-connection switching device 60 are controlled by means of a control device 40 such that, in case of the normal operation of the inverter, the partial strings 70a, 70b of the generator 70 are connected to the inverter 20 in a series connection. In case of a hazard, the control device 40 controls the series-connection switching device 50 such that the electrical connection between the two partial strings 70a, 70b is opened. By this configuration, voltages or voltage differences on the lines to the generator 70 are substantially reduced, specifically to the effect that, by an appropriate configuration of the two partial strings 70a, 70b, any contact of persons with hazardous voltages or voltage differences on the electrical lines of the generator 70 can be precluded. In case of a hazard, the control device 40 also controls the parallel-connection switching device 60 such that the two partial strings 70a, 70b are connected together in parallel. Accordingly, in case of a hazard, current continues to flow to the inverter 20, but at a reduced voltage level. The generator 70 can continue the feeding of electric power to the electricity grid 30 via the inverter 20. To this end, the inverter 20 is typically provided with a step-up converter (not shown), which can convert the operating voltage of the parallel-connected partial strings 70a, 70b into a sufficiently high voltage to permit the feeding of power to the electricity grid 30.

As an option, as represented in the example of embodiment shown in FIG. 1, a short-circuiting device 110 may be arranged between the connecting lines 120, 130 that is also controlled by the control device 40 and that, in case of a hazard, can be used to connect the connecting line 120 with the connecting line 130. The photovoltaic installation may also be provided with a d.c. disconnecting device 80 on the connecting lines 120, 130, which is also controlled by the control device 40, in order to allow the generator 70 to be isolated from the inverter 20.

The control device 40 is configured to analyze operating states of the photovoltaic installation, or receive a signal that is transmitted to the control device from within or from outside the photovoltaic installation. Specifically, signals may be generated e.g. by an emergency tripping device or by a monitoring component of the photovoltaic installation. Upon the detection of an operating state that is associated with a hazard condition, or upon the reception of a signal that is associated with a hazard condition, by the control device 40, the latter will actuate a corresponding control function on the switches in one or more of the series-connection switching device 50, the parallel-connection switching device 60, the short-circuiting device 110 and the d.c. disconnecting device 80.

Figure 2:
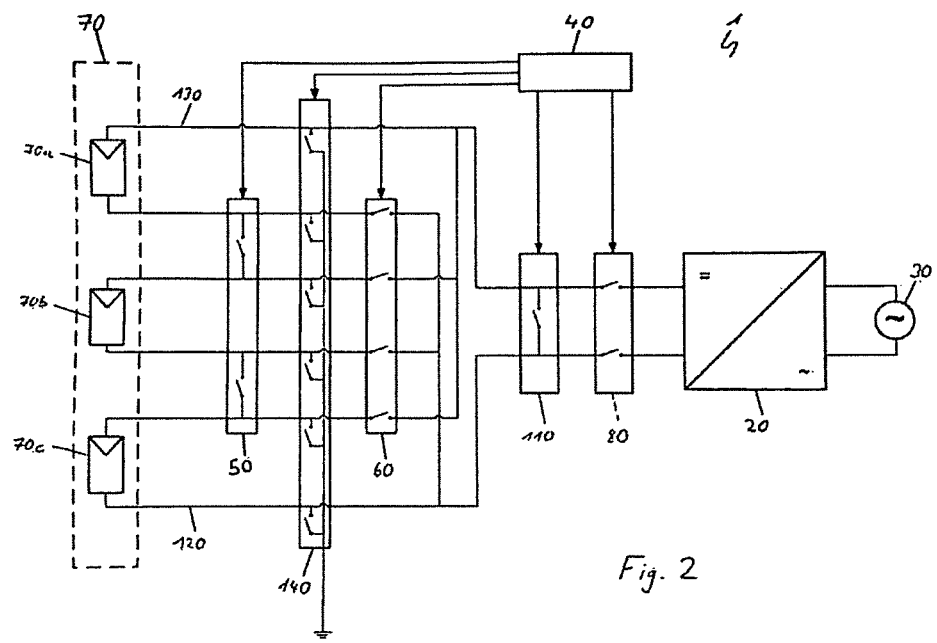
FIG. 2 shows a further photovoltaic installation according to one embodiment of the invention, with an additional d.c. disconnecting device, an additional short-circuiting device and an additional grounding device.

FIG. 2 shows a further variant of the embodiment of the device according to the invention. In this case, the generator 70 comprises three partial strings 70a, 70b, 70c, that can be connected together in series by means of a series-connection switching device 50. The individual partial strings 70a, 70b, 70c may be connected in parallel to each other by means of a parallel-connection switching device 60. By means of an optional grounding device 140, the terminals of the partial strings may also be connected to ground. The series-connection switching device 50, the parallel-connection switching device 60 and the grounding device 140 are controlled by the control device 40. By this configuration, in case of the normal operation of the photovoltaic installation 1, it is achieved that the operating voltages of the partial strings 70a, 70b, 70c are combined to give a value that exceeds the peak voltage of the electricity grid 30 connected to the inverter 20. In case of a hazard, as a result of the series connection of the partial strings 70a, 70b, 70c being opened by means of the series-connection switching device 50 and the parallel arrangement of the partial strings 70a, 70b, 70c being established by means of the parallel-connection switching device 60, it can be achieved that only voltage differences that pose no hazard to persons can occur on the electrical lines between the inverter 20 and the generator 70, and at the same time the photovoltaic installation can continue to feed power into the electricity grid. As already described with reference to the example embodiment shown in FIG. 1, for this purpose the inverter 20 typically has a step-up converter (not shown), which can convert the operating voltage of the parallel-connected partial strings 70a, 70b, 70c into a sufficiently high voltage to permit the feeding of power to the electricity grid 30. This way the photovoltaic installation can be transferred into a safe-to-touch condition, without the need for the complete shut-off of the operation of the installation. By means of the grounding device 140, it can also be ensured that the terminals of the partial strings will show defined potentials with respect to ground. This can be achieved by the actuation of the corresponding switches as a subset of the switches of the grounding device 140 represented in FIG. 2. It is evident that by connecting both terminals of a given partial string to ground, the partial string can be effectively short-circuited. In the embodiment according to FIG. 2, all the switches of the grounding device are connected to ground via a common line. Alternatively, each of the switches of the grounding device may be connected to ground individually.

Figure 3:
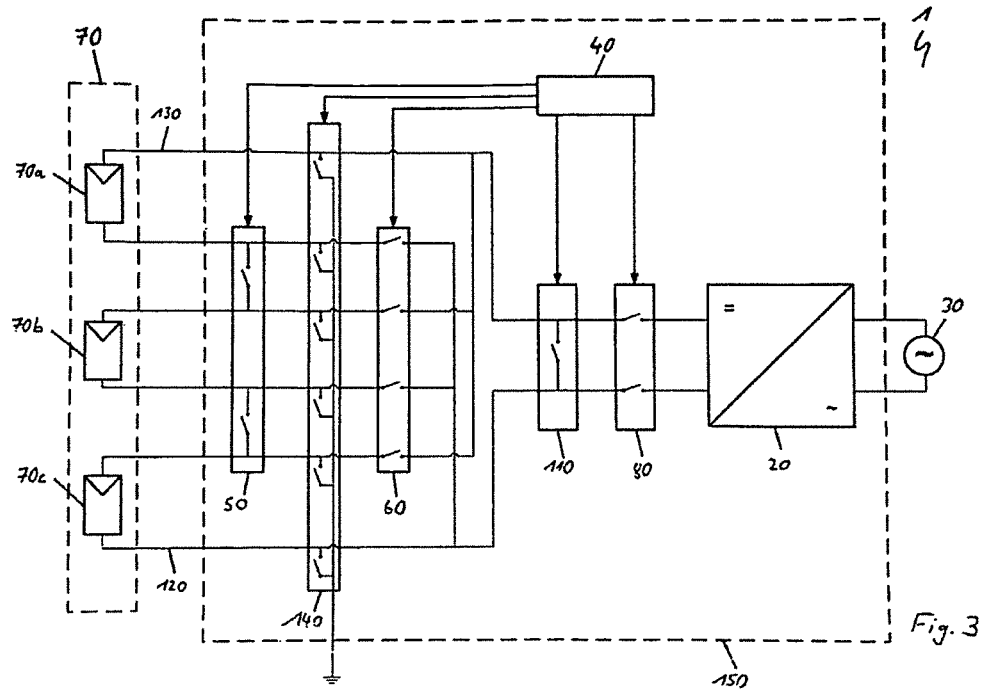
FIG. 3 shows a further photovoltaic installation according to one embodiment of the invention, in which the switching elements are arranged in common units within the inverter.

FIG. 3 shows a further variant of an embodiment of a device according to the invention, in which the switching elements of the series-connection switching device 50, the parallel-connection switching device 60 and the grounding device 140 are respectively arranged in a common unit. In the embodiment shown in FIG. 3, however, the series-connection switching device 50, the parallel-connection switching device 60, the grounding device 140, the short-circuiting device 110, the d.c. disconnecting device 80 and the control device 40 are now arranged inside an inverter housing 150, whereby the functional reliability of these components in case of a hazard is substantially enhanced.

Figure 4:
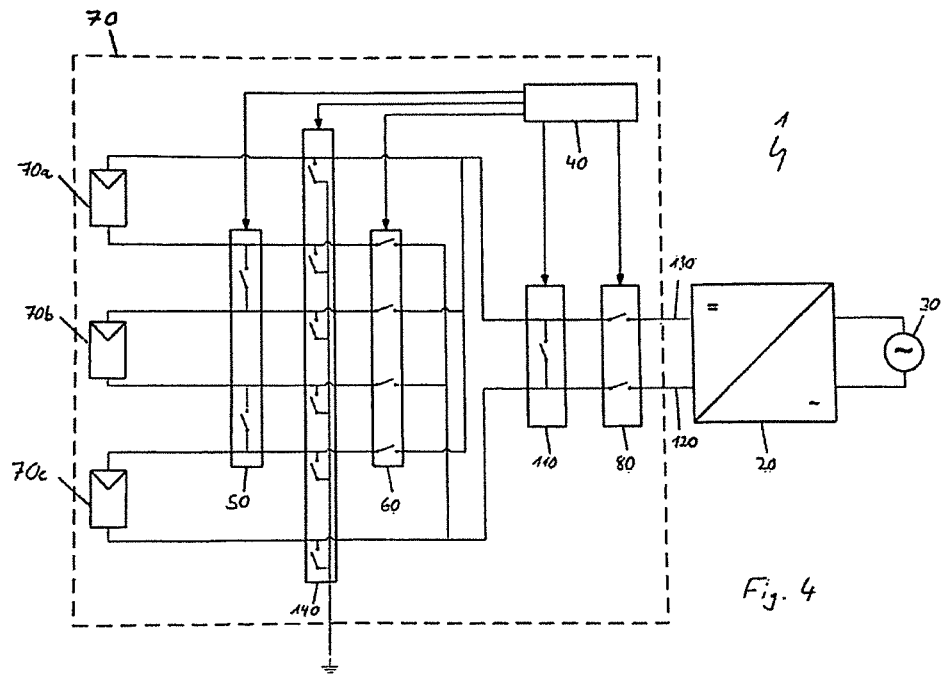
FIG. 4 shows a further photovoltaic installation according to one embodiment of the invention, in which the switching elements are arranged in common units at the generator.

FIG. 4 shows a further variant of an embodiment of a device according to the invention, in which the switching elements of the series-connection switching device 50, the parallel-connection switching device 60 and the grounding device 140 are respectively arranged in a common unit. In the embodiment shown in FIG. 4, however, the series-connection switching device 50, the parallel-connection switching device 60, the grounding device 140, the short-circuiting device 110, the d.c. disconnecting device 80 and the control device 40 are now arranged at the generator and, specifically, are component parts of the generator 70. By this configuration, expenditure on cabling for the photovoltaic installation, specifically for cable connections between the generator 70 and the inverter 20, can be reduced in comparison to the embodiment shown in FIG. 3.

Figure 5:
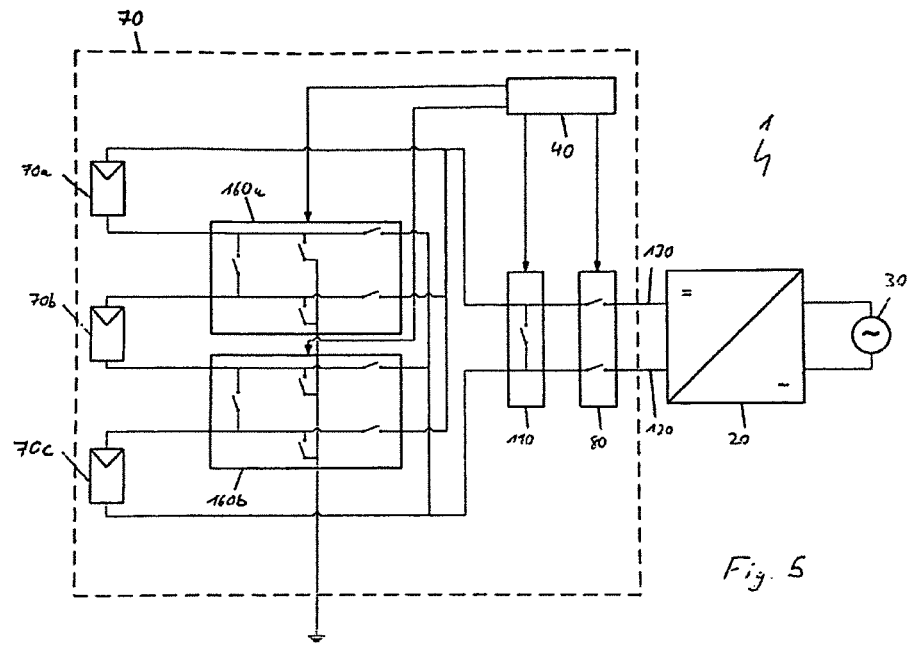
FIG. 5 shows a further photovoltaic installation according to one embodiment of the invention, in which the switching elements are arranged in separate units between two partial strings each.

FIG. 5 shows a further variant of an embodiment of a device according to the invention in which, as in FIG. 4, the switching elements of the series-connection switching device, the parallel-connection switching device and the grounding device, as well as the short-circuiting device 110, the d.c. disconnecting device 80 and the control device 40 are arranged at the generator and, specifically, are component parts of the generator 70. However, the switching elements of the series-connection switching device, the parallel-connection switching device and the grounding device are not respectively arranged in a common unit, as in the embodiment shown in FIG. 4, but are arranged in separate units 160a, 160b between two of the partial strings 70a, 70b, 70c each, that means, each separate unit is connected to a repective terminal of adjacent partial strings. FIG. 5 also shows that variants of the embodiment of the device according to the invention exist in which not all the terminals of all the partial strings are configured to be connected to ground by means of the optional grounding device.

Figure 6:
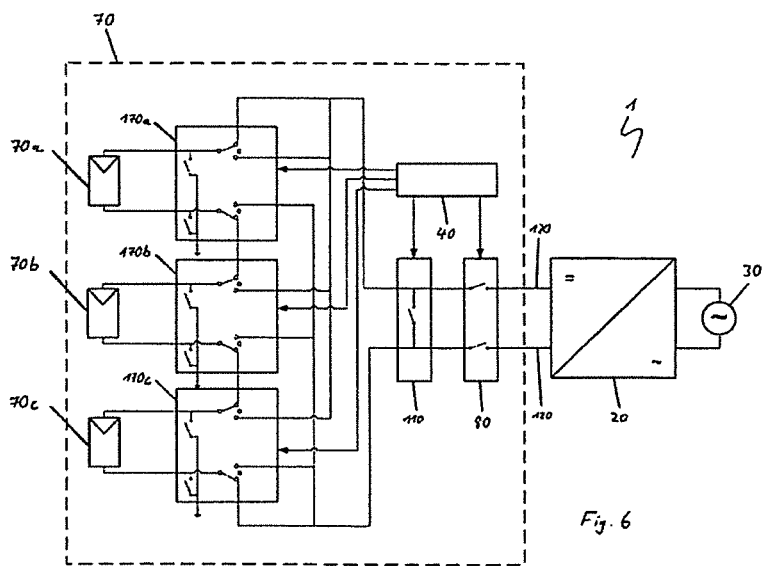
FIG. 6 shows a further photovoltaic installation according to one embodiment of the invention, in which the switching elements are arranged in separate units, each of which is associated with a partial string.

FIG. 6 shows a further variant of an embodiment of a device according to the invention, in which the switching elements are component parts of the generator 70. In this case, the switching elements of the series-connection switching device, the parallel-connection switching device and the grounding device are arranged in separate units 170a, 170b, 170c each associated with one of the partial strings 70a, 70b, 70c respectively, that means, each unit is connected to both terminals of a single partial string in each case. The series-connection switching device and the parallel-connection switching device are realized by using triple selector switches that can, depending upon the setting of the switch, effect the series connection, the opening of the series connection or the establishment of the parallel connection of the partial strings 70a, 70b, 70c. Instead of the triple selector switches, connections of two simple on-off switches in each case can also be used.

Figure 7:
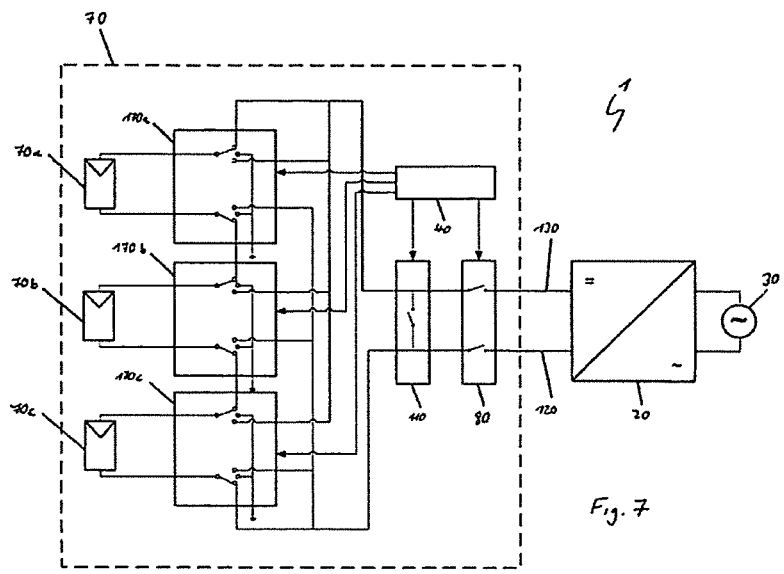
FIG. 7 shows a further photovoltaic installation according to one embodiment of the invention, in which the switching elements are arranged in separate units, each of which is associated with a partial string.

FIG. 7 shows a further variant of an embodiment of a device according to the invention, in which the switching elements are component parts of the generator 70, i.e., are arranged at the latter, and in which the switching elements of the series-connection switching device, the parallel-connection switching device and the grounding device are arranged in separate units 170a, 170b, 170c each associated with one of the partial strings 70a, 70b, 70c respectively, that means, each unit is connected to both terminals of a single partial string in each case. In this case, the series-connection switching device, the parallel-connection switching device and the grounding device are configured here with exceptionally low expenditure by the use of triple selector switches. In this embodiment, however, overall fewer circuit states are available than in the embodiments described before, since, depending upon the position of the switch, either there is a series connection of the partial strings 70a, 70b, 70c, or a parallel connection of the partial strings 70a, 70b, 70c, or a connection of the terminals of the partial strings 70a, 70b, 70c to ground. This restriction can likewise be overcome by the use of a number of on-off switches in place of the triple selector switches.

Furthermore, many other variants of embodiments of a device according to the invention are possible that are not shown here, the majority of which simply result from a variation and/or combination of the arrangements of switches, units and devices at the generator 70, in the inverter housing 150 or between the generator 70 and the inverter 20, embodiments disclosed before. Further, partial strings that are connected in series by means of a series-connection switching device may also be connected in parallel, such that a device according to the invention may also comprise a number of series-connection switching devices, parallel-connection switching devices, grounding devices, short-circuiting devices and d.c. disconnecting devices.

Figure 8:
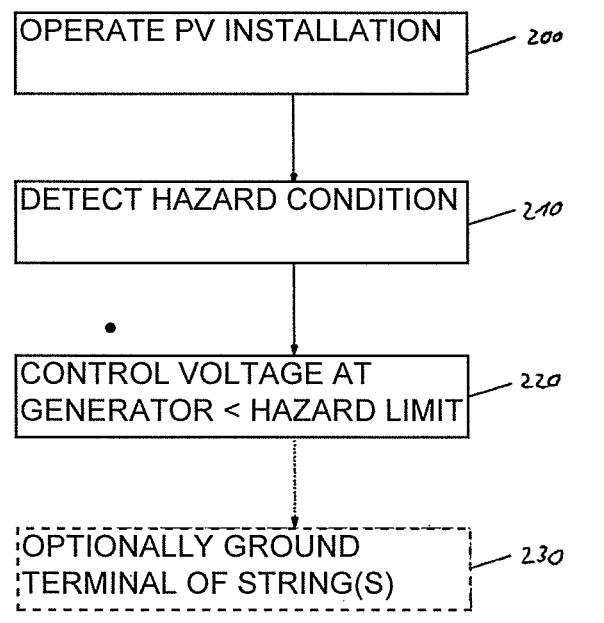
FIG. 8 shows a flow chart illustrating a method according to one embodiment of the invention for the limitation of the generator voltage in case of a hazard.

FIG. 8 shows a flow chart that corresponds to a method according to the invention. At 200, the photovoltaic installation is operating at a voltage at the generator 70 that exceeds a hazard limit value. As soon as a hazard condition is detected at 210, the voltage at the generator 70 is controlled to a value that lies below the hazard limit value at 220. The control of the generator voltage can be achieved by the switching of the series configuration of the partial strings 70a, 70b, 70c of the generator 70 to a parallel configuration, e.g., by means of the series-connection switching device 50 and the parallel-connection switching device 60. Alternatively, the control of the generator voltage may also be achieved by means of the appropriate control of a step-up converter that is a part of an inverter that is provided for the feeding energy generated by the generator 70 to an electricity grid 30. As an option, at 230 of the method, an electrical connection of at least one of the terminals of at least one of the partial strings 70a, 70b, 70c to ground may be carried out.

Figure 9:
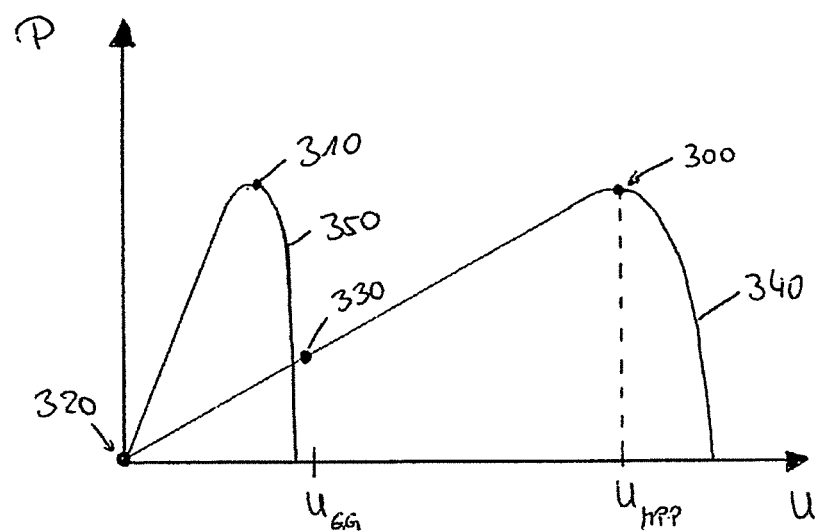
FIG. 9 shows a graph illustrating examples of power curves, for illustrating displacements in the operating point.

FIG. 9 shows two power curves for a photovoltaic installation, as a function of the generator voltage U. A first curve 340 shows the characteristics of power P for a generator in case of the series connection of the partial strings. The maximum power output is achieved for an operating point 300 at which the value of the generator voltage $U_{MPP}$ exceeds a hazard limit value $U_{GG}$. If upon the detection of a hazard situation it is necessary for the generator voltage to be controlled to a value that lies below the hazard limit value $U_{GG}$, the operating point of the generator may be shifted, e.g. to an operating point 330 that lies just below the hazard limit value $U_{GG}$, whereupon the power that is fed in as compared to the potential maximum power output at the operating point 300 is reduced.

If upon the detection of a hazard situation the partial strings are reconfigured from series connection to parallel connection, this will result in a second power curve 350 in which, in the example considered, the generator voltage remains below the hazard limit value $U_{GG}$ over the entire course. In this way, it is possible for the generator to continue operation at the point of maximum power output 310, such that the feeding of electric energy can happen substantially unchanged as compared the series connection.

If the generator remains in series connection, i.e., is operating at the operating point 330 in case of a hazard condition, it is necessary, upon the separation of the inverter from the electricity grid or in other cases in which the feeding of electric power to the electricity grid is no longer possible, to achieve an operating point at which the power output of the generator is zero and the generator voltage at the same time lies below the hazard limit value $U_{GG}$. Such an operating point is the short-circuit point 320, which can be achieved by short-circuiting the generator.

The invention claimed is:

1. A protection system configured to couple between a generator that has a number of partial strings and an inverter, comprising:
   a control device;
   a series-connection switching device configured to selectively connect the partial strings together in series; and
   a parallel-connection switching device configured to selectively connect the partial strings together in parallel,
   wherein the series-connection switching device is actuated by the control device such that it interrupts the series connection of the partial strings in case of a hazard, and the parallel-connection switching device is actuated by the control device such that it connects the partial strings together in parallel in case of a hazard.

2. The protection system as claimed in claim 1, further comprising a grounding device that is controlled by the control device such that, in case of a hazard, the grounding device connects at least one of the terminals of at least one of the partial strings to ground.

3. The protection system as claimed in claim 1, wherein the partial strings are dimensioned such that the maximum voltage thereof is lower than 120 volts.

4. The protection system as claimed in claim 1, wherein the generator comprises at least three partial strings.

5. The protection system as claimed in claim 1, further comprising a short-circuiting device that is controlled by the control device, wherein the short-circuiting device is configured to selectively short-circuit the partial strings.

6. The protection system as claimed in claim 1, further comprising a d.c. disconnecting device that is controlled by the control device, wherein the d.c. disconnecting device is configured to selectively disconnect the partial strings from the inverter.

7. The protection system as claimed in claim 1, wherein the series-connection switching device and the parallel-connection switching device are respectively arranged in a common unit.

8. The protection system as claimed in claim 1, wherein switching elements of the series-connection switching device and switching elements of the parallel-connection switching device are arranged together, respectively, in separate units between two of the partial strings.

9. The protection system as claimed in claim 1, wherein the switching elements of the series-connection switching device and switching elements of the parallel-connection switching device are arranged in separate units, each of which is associated with one of the partial strings.

10. The protection system as claimed in claim 1, wherein the series-connection switching device comprises a relay or a semiconductor switch.

11. The protection system as claimed in claim 1, wherein the parallel-connection switching device comprises a relay or a semiconductor switch.

12. The protection system as claimed in claim 1, wherein the control device is configured to detect an operating state of the photovoltaic installation that is associated with a hazard condition.

13. The protection system as claimed in claim 1, wherein the control device is configured to receive a signal that is associated with a hazard condition, and that is transmitted to the control device via a control line, by wireless connection, or via connecting lines to the partial strings or to an electricity grid.

14. A method for limiting a voltage of a generator of a photovoltaic installation in case of a hazard, comprising:
 operating the photovoltaic installation at a generator voltage that exceeds a hazard limit value;
 detecting a hazard condition; and
 controlling the generator voltage to a value that lies below the hazard limit value, in response to the detection of the hazard condition;
 wherein controlling the generator voltage to a value that lies below the hazard limit value comprises switching the partial strings of the generator from a series configuration to a parallel configuration and maintaining the parallel configuration while the hazard condition is detected.

15. The method as claimed in claim 14, further comprising establishing an electrical connection between at least one of the terminals of at least one of the partial strings and ground, in response to the detection of a hazard condition.

16. The method as claimed in claim 14, wherein controlling the generator voltage to a value that lies below the hazard limit value is achieved by means of a step-up converter, which converts the generator voltage to a specific input voltage value for an inverter.

17. The method as claimed in claim 14, wherein detecting a hazard condition comprises detecting one of the following:
 occurrence of an islanding situation;
 detection of an arc on the electrical lines of the photovoltaic installation;
 detection of a ground fault on the electrical lines of the photovoltaic installation;
 tripping of a generator disconnection device;
 tripping of a manual emergency shutdown device;
 response of an external sensor device;
 detection of variations in electrical parameters on the photovoltaic installation that are typically indicative of a hazard; and
 reception of a further signal that is associated with a hazard condition from a further photovoltaic installation or a further inverter, the photovoltaic installation is connected to in a data network.

18. The method as claimed in claim 14, wherein the hazard limit value lies between 60 volts and 150 volts.

19. The method as claimed in claim 14, wherein during the controlling of the generator voltage to a value that lies below the hazard limit value, further comprising continuing to feed electric power to an electricity grid to which the photovoltaic installation is connected.

20. The method as claimed in claim 14, wherein controlling the generator voltage to a value that lies below the hazard limit value comprises short-circuiting one of the partial strings of the generator.

21. The method as claimed in claim 14, wherein a series-connection switching device is configured to connect the partial strings of the generator in series and a parallel-connection switching device is configured to connect the partial strings of the generator in parallel, wherein the series-connection switching device and the parallel-connection switching device are different.

* * * * *